(12) United States Patent
Takenaka et al.

(10) Patent No.: US 9,607,984 B2
(45) Date of Patent: Mar. 28, 2017

(54) COMMON DRAIN SEMICONDUCTOR DEVICE STRUCTURE AND METHOD

(71) Applicant: Semiconductor Components Industries, LLC, Phoenix, AZ (US)

(72) Inventors: Kazumasa Takenaka, Ora-gun (JP); Hidehito Koseki, Yokkaichi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 107 days.

(21) Appl. No.: 14/518,906

(22) Filed: Oct. 20, 2014

(65) Prior Publication Data

US 2016/0035721 A1 Feb. 4, 2016

Related U.S. Application Data

(60) Provisional application No. 62/032,191, filed on Aug. 1, 2014.

(51) Int. Cl.
*H01L 27/088* (2006.01)
*H01L 29/423* (2006.01)
(Continued)

(52) U.S. Cl.
CPC .... *H01L 27/088* (2013.01); *H01L 21/823475* (2013.01); *H01L 21/823487* (2013.01); *H01L 23/3171* (2013.01); *H01L 23/4824* (2013.01); *H01L 23/60* (2013.01); *H01L 24/05* (2013.01); *H01L 24/06* (2013.01); *H01L 27/0207* (2013.01); *H01L 29/41758* (2013.01); *H01L 29/4236* (2013.01); *H01L 21/823425* (2013.01); *H01L 24/03* (2013.01); *H01L 24/13* (2013.01); *H01L 24/29* (2013.01); *H01L 27/0629* (2013.01); *H01L 2224/0345* (2013.01); *H01L 2224/0348* (2013.01); *H01L 2224/03462* (2013.01); *H01L 2224/03464* (2013.01); *H01L 2224/03614* (2013.01); *H01L 2224/0401* (2013.01); *H01L 2224/04026* (2013.01); *H01L 2224/04034* (2013.01); *H01L 2224/04042* (2013.01); *H01L 2224/05019* (2013.01); *H01L 2224/05022* (2013.01);
(Continued)

(58) Field of Classification Search
CPC ........... H01L 27/10841; H01L 27/0207; H01L 27/10876; H01L 21/823425; H01L 21/823475; H01L 21/823487; H01L 2224/0401; H01L 2224/05022; H01L 2224/06051; H01L 23/4824; H01L 24/06; H01L 29/4236

See application file for complete search history.

(56) References Cited

U.S. PATENT DOCUMENTS

| 7,605,435 B2 | 10/2009 | Anderson et al. | |
| 9,129,991 B2 * | 9/2015 | Rutter | H01L 29/7803 |
| 2005/0224887 A1 * | 10/2005 | Matsuki | H01L 29/7813 257/368 |

FOREIGN PATENT DOCUMENTS

| JP | 2012-174726 | 9/2012 |
| JP | 2013-161977 | 8/2013 |

* cited by examiner

*Primary Examiner* — Bac Au
(74) *Attorney, Agent, or Firm* — The Noblitt Group, PLLC

(57) ABSTRACT

In one embodiment, a common drain semiconductor device includes a substrate, having two transistors integrated therein. The substrate also includes a plurality of active regions on a major surface of the substrate. The active regions of each transistor may be interleaved.

17 Claims, 4 Drawing Sheets

(51) Int. Cl.
  *H01L 23/31* (2006.01)
  *H01L 23/00* (2006.01)
  *H01L 29/417* (2006.01)
  *H01L 23/482* (2006.01)
  *H01L 23/60* (2006.01)
  *H01L 27/02* (2006.01)
  *H01L 21/8234* (2006.01)
  *H01L 27/06* (2006.01)
(52) U.S. Cl.
  CPC ............... *H01L 2224/05083* (2013.01); *H01L 2224/05096* (2013.01); *H01L 2224/05124* (2013.01); *H01L 2224/05554* (2013.01); *H01L 2224/05555* (2013.01); *H01L 2224/05564* (2013.01); *H01L 2224/05571* (2013.01); *H01L 2224/05639* (2013.01); *H01L 2224/05647* (2013.01); *H01L 2224/05655* (2013.01); *H01L 2224/05657* (2013.01); *H01L 2224/05664* (2013.01); *H01L 2224/05669* (2013.01); *H01L 2224/06051* (2013.01); *H01L 2224/131* (2013.01); *H01L 2224/133* (2013.01); *H01L 2224/1329* (2013.01); *H01L 2224/291* (2013.01); *H01L 2224/293* (2013.01); *H01L 2224/2929* (2013.01); *H01L 2924/13091* (2013.01)

COMMON DRAIN SEMICONDUCTOR DEVICE STRUCTURE AND METHOD

CROSS REFERENCE TO RELATED APPLICATIONS

This application claims the benefit of the U.S. Provisional Application No. 62/032,191, filed on Aug. 1, 2014, which is incorporated herein by reference.

BACKGROUND

Embodiments disclosed in the present invention relate generally to electrical technology, and more specifically to a semiconductor component and method of fabricating the same.

Semiconductor devices providing a bi-directional circuit by the use of a pair of transistors sharing a common drain have become more desirable since the common drain connected transistors allow more efficient current conduction in a monolithic integrated circuit. However, due to the configuration of transistors and the vertical current conduction, a region of reduced electric current density is observed. The current density can be improved by arranging the source regions to have greater uniformity across the entirety of the device. In addition, for the dual common drain architecture, the major cause of source-to-source on-resistance are the main device resistance, the substrate resistance, and back metal resistance, primarily due to lateral current flow from one source to the other. In the past, attempts to reduce this resistance included one or all of the following: (i) thinner substrate and thicker back metal, (ii) lower resistivity back metal, and/or (iii) reduced distance from the first to the second source areas. However, some of these methods to reduce the on-resistance present challenges; for example, by producing a thinner wafer, the risk of wafer cracking increases as the wafer thickness decreases. The previous devices also have a back metal, which increases the cost of the device.

Accordingly, it would be desirable to have a common drain semiconductor device structure that has a lower source-to-source on-resistance and greater uniformity to produce increased electrical current density, without the need for a thinner wafer. It would also be desirable to decrease the cost of the device by omitting the back metal.

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that the words "during", "while", and "when" as used herein relating to circuit operation are not exact terms that mean an action takes place instantly upon an initiating action but that there may be some small but reasonable delay, such as propagation delay, between the reaction that it initiated by the initial action. Additionally, the term "while" means that a certain action occurs at least with some portion of duration of the initiating action. The use of the word "approximately" or "substantially" means that a value of an element has a parameter that is expected to be close to a stated value or position. However, as is well known in the art there are always minor variances that prevent the value or positions from being exactly as stated. It is well established in the art that variances of up to at least 10 percent (10%) are reasonable variances from the ideal goal of exactly as described. The terms "first", "second", "third" and the like in the Claims and/or in the Detailed Description of Drawings, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corner. However, those skilled in the art understand that due to the diffusion and activation of dopants, the edges of doped regions generally may not be straight lines and the corners may not be precise angles.

DETAILED DESCRIPTION OF THE DRAWINGS

Figure 1:
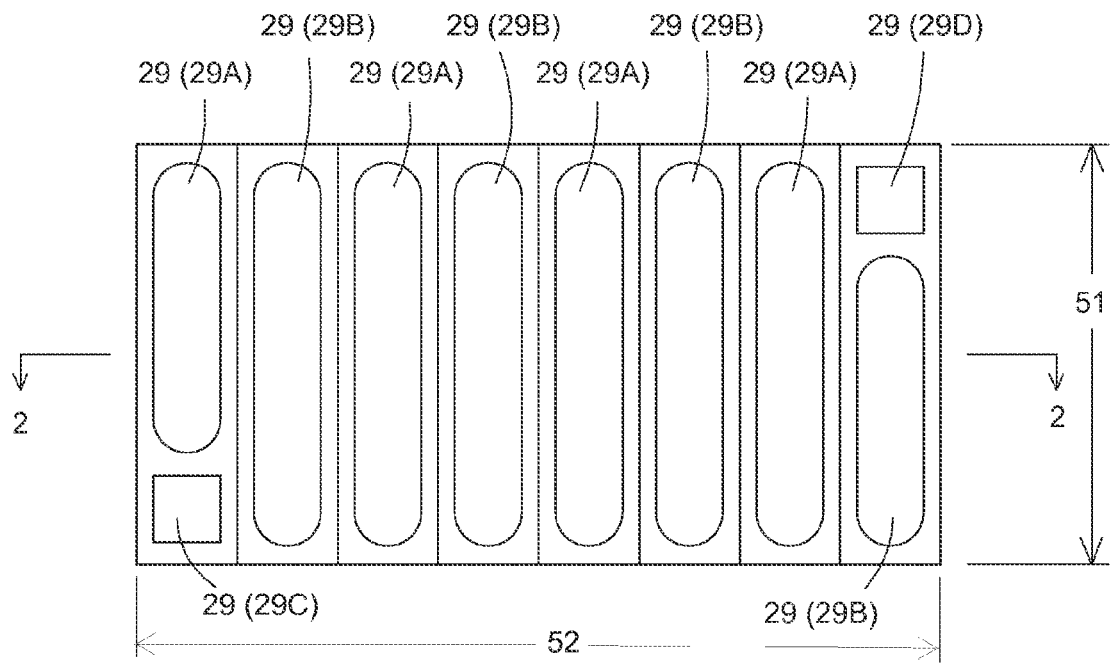
FIG. 1 illustrates a top view of a common drain semiconductor device in accordance with an embodiment of the present invention.

FIG. 1 illustrates a top view of the common drain semiconductor device 10 in accordance with one embodiment. In this embodiment, device 10 includes conductive pads 29 formed on a surface of the under bump structure 28 (illustrated in FIG. 2), for accepting an external electrical contact, such as solder bumps, electrical adhesive(s) or any other types of electrical connecting means as known to those of ordinary skill in the art. In one embodiment, at least one conductive pad 29 may be formed in a stripe pattern along the width 51 of the semiconductor device 10 with two square-shaped conductive pads 29C and 29D located in diagonal corners of the device. In a present embodiment, the device 10 is configured having a first transistor and a second transistor partitioned as an input source and an output source, respectively, or vice versa. For example, first conductive pads 29A may belong to a first transistor 12 (illustrated in FIG. 5) to provide an electrical input/output and second conductive pads 29B may belong to a second transistor 13 (illustrated in FIG. 5) to provide an electrical input/output. Further, a first gate pad 29C may belong to the first transistor 12 to provide an external gate contact, and a second gate pad 29D may belong to the second transistor 13 to provide an external gate contact.

Figure 2:
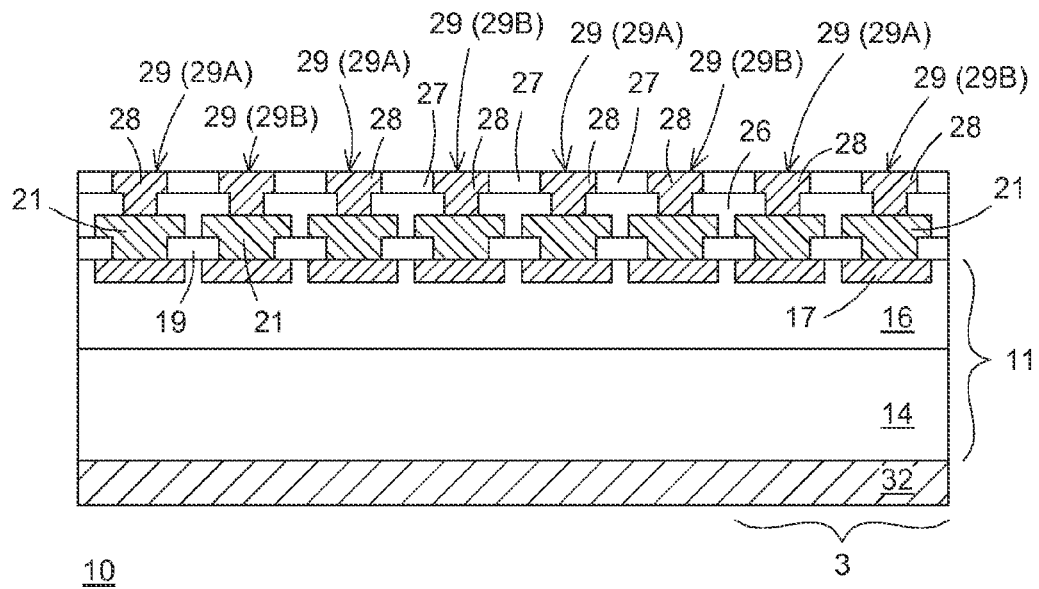
FIG. 2 illustrates a cross-sectional view of the common drain semiconductor device of FIG. 1 in accordance with an embodiment of the present invention.
Figure 3:
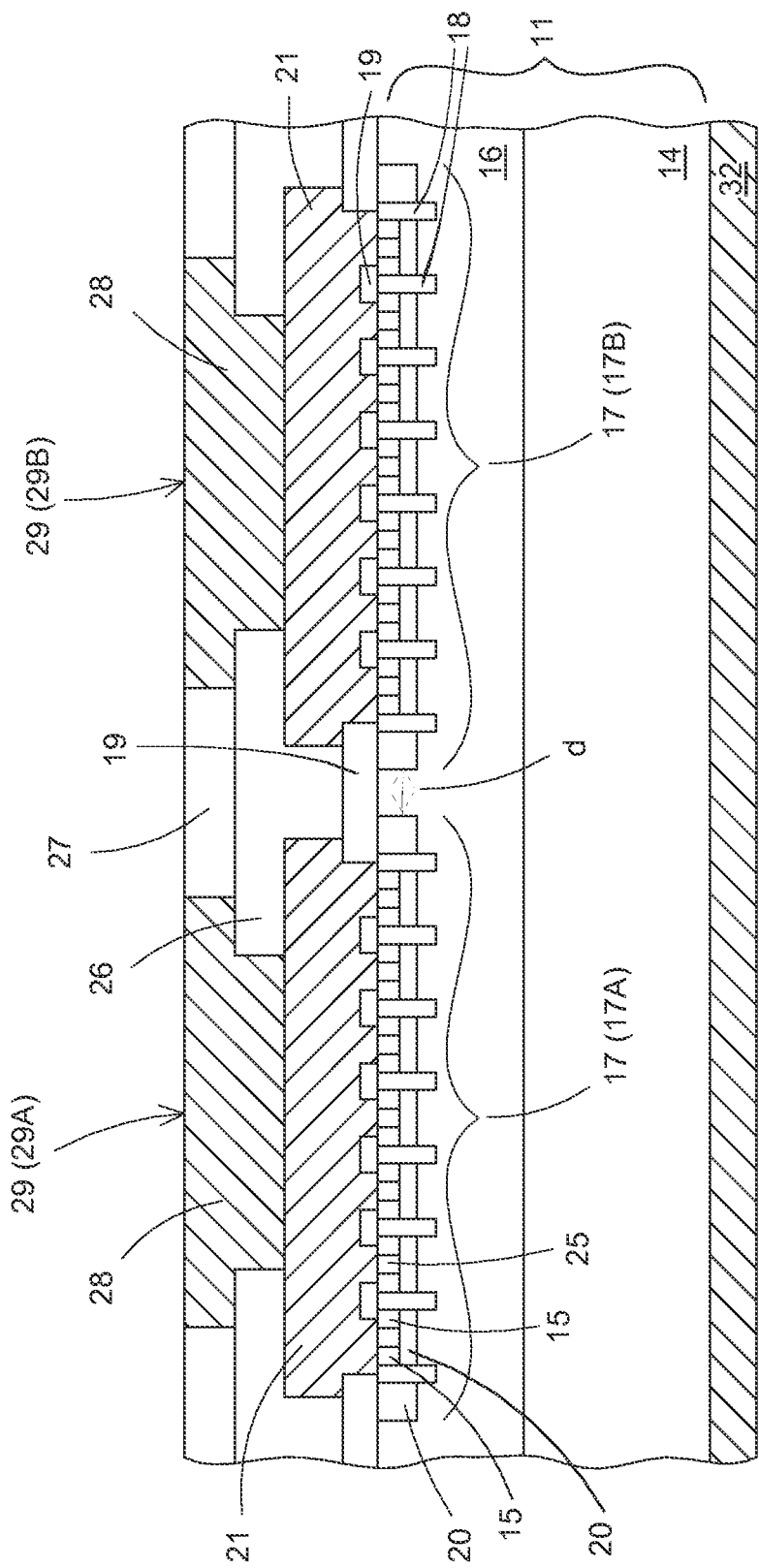
FIG. 3 illustrates an expanded view of a portion of the cross-sectional semiconductor device of FIG. 2 in accordance with an embodiment of the present invention.

FIGS. 2 and 3 illustrate cross-sectional views of common drain semiconductor device 10 of FIG. 1, where FIG. 3 illustrates an expanded view of a portion of the cross-sectional semiconductor device of FIG. 2. The embodiment depicted in FIG. 1, demonstrating a stripe pattern of the conductive pads 29, is also demonstrated in FIG. 2, where one embodiment of the device may have alternating conductive pads 29.

As illustrated in FIGS. 2 and 3, the semiconductor device 10 provides an integrated circuit having a substrate 11 which is formed by layering a first semiconductor layer 14 and a second semiconductor layer 16. The first semiconductor layer 14 has a first conductivity type, for example n-type or p-type. The second semiconductor layer 16 has a second conductivity type, for example n-type or p-type, and may be an epitaxial layer of single crystal silicon grown on top of the first semiconductor layer 14. In one embodiment, the semiconductor device 10 may also have a third conductive layer 32. The third conductive layer 32 may be a composite, for example titanium, nickel, copper, nickel (Ti/Ni/Cu/Ni), or any other combination of suitable metals. In prior devices, the third conductive layer was used to provide lower resistance, however in one embodiment, providing the third conductive layer did not alter the resistance, and therefore may be omitted.

FIGS. 2 and 3 further illustrate a plurality of active regions 17 which may be formed in the substrate 11. For example, the plurality of active regions 17 may be formed in the second semiconductor layer 16. The plurality of active regions 17 may include one or more body layers 20 (which are configured to form channel regions), a plurality of source regions 15, a plurality of body contact regions 25, and a plurality of gate trench structures 18 (FIG. 3). The body layer 20 may be a p-type impurity region. The plurality of gate trench structures 18 pass through the body layer 20 to reach the second semiconductor layer 16. In one embodiment, at least one of the plurality of gate trench structures 18 may be patterned into a stripe shape along the width 51 of the device 10. In another embodiment, the gate trench structures 18 do not overlap with the first gate pad 29C or the second gate pad 29D. In accordance with the present embodiment, by increasing the number of the plurality of gate trench structures 18, the density of the plurality of active regions 17 increases, thereby reducing the drain-to-source resistance. The plurality of source regions 15 may be an n-type impurity region. The plurality of body contact regions 25 may be a p-type impurity region and are provided between adjacent source regions in order to stabilize the electropotential of the substrate. When both transistors 12 and 13 are on, an electrical current of the first transistor 12 flows from the conductive pad (for example 29A), between the plurality of gate trench structures 18 of the active region 17A into the second semiconductor layer 16 and the first semiconductor layer 14 (and in an embodiment where a third conductive layer is provided, the current also flows into the third conductive layer). The electrical current then flows horizontally across the first semiconductor layer 14 and the second semiconductor layer 16 (and horizontally across the third conductive layer in an embodiment where one is provided), and back up through the body layers 20 of an adjacent active region 17 (for example 17B) and to the conductive pad 29 of the second transistor 13 (for example, conductive pad 29B). In one embodiment, the plurality of active regions 17 is separated by a distance d of 35 microns. Other embodiments may provide a distance d less than 58 microns. In one embodiment, the active regions 17 may have a width of approximately 365 microns. In one embodiment, the plurality of active regions 17 may have equal widths. The distance d between the plurality of active regions 17 is inversely proportional to the current density, such that as the distance d decreases, current density increases. The width of the plurality of active regions 17 are less than that of previous devices, providing a more direct electrical current flow path from an active region 17, for example 17A, to an adjacent active region 17, for example 17B, which further reduces resistance, thereby increasing current density of the device 10.

FIG. 2 further illustrates an interlayer dielectric layer 19 formed and patterned on the surface of the plurality of active regions 17, which serves as an insulating layer and used to electrically separate closely spaced interconnects and prevent passage of electrical current. The interlayer dielectric layer 19 may be made with silicon dioxide ($SiO_2$), a material with a high dielectric constant, or any other material suitable for providing insulation.

FIG. 2 further illustrates a conductive layer 21 formed on the plurality of active regions and the interlayer dielectric layer 19. The conductive layer 21 is formed using, for example, an evaporation process, and may be made of aluminum. The conductive layer 21 is then patterned using, for example, a photolithographic process and a wet chemical etch process.

A first passivation layer 26 is formed and patterned on the interlayer dielectric layer 19 and the conductive layer 21 creating first openings. The first passivation layer 26 provides a diffusion barrier against contaminants, such as water molecules and sodium ions, which are the main sources of corrosion and instability in semiconductor devices. In one embodiment, the first passivation layer 26 comprises a silicon nitride material ($Si_xN_y$), for example $Si_3N_4$, but could also be made of other electrically insulating material such as various ternary compounds of silicon, nitrogen and hydrogen ($SiN_xH_y$).

A second passivation layer 27 is formed and patterned on a surface of the first passivation layer 26 creating second openings. The second passivation layer 27 may be a polyimide layer to protect the surface from scratches, provide an adhesion to the underlying layer, and demonstrate minimal shrinkage during curing. The patterning methods for the second passivation layer 27 may include wet etching with solutions of organic amines using photoresist masks, plasma (dry) etch using photoresist masks, or directly patterning the second passivation layer using photosensitive films. In other embodiments, the second passivation layer 27 can be other dielectric materials, such as oxides or other materials as known to one of ordinary skill in the art.

FIG. 2 further illustrates an under bump structure 28 which is a solderable metal, such as nickel, cobalt, palladium, platinum, copper, silver or a variety of alloys involving one or more of these metals, formed in the first openings of the first passivation layer 26 and the second openings of the second passivation layer 27, and may be deposited through evaporated, sputtered, electroplated or electroless techniques. The under bump structure 28 serves as an interface between the metal layer 21 and an electrical contact, where the electrical contact may be solder bumps, solder structures, conductive epoxies, clips, wire bonds or any other electrically conductive material. A surface of the under bump structure 28 provides a conductive pad 29, for example, as shown in FIG. 1, to accept an electrical contact such as solder or electrical adhesive. When both transistors are on, an electrical current provided to the conductive pad, for example 29A, of the first transistor 12 flows between the plurality of gate trench structures 18 into the second semiconductor layer 16 and the first semiconductor layer 14. The electrical current then flows across the first semiconductor layer 14 and the second semiconductor layer 16 and back up through body layers 20 formed adjacent the plurality of gate trench structures 18 of an adjacent conductive pad 29, for example 29B, of the second transistor 13. Alternatively, if the polarity between the first transistor 12 and the second transistor 13 is reverse, the device will conduct electrical current in the opposite direction.

In one embodiment, the plurality of active regions 17, together with the respective conductive layer 21 and the under bump structure 28, are finger-shaped, which provides multiple finger-shaped regions for each transistor 12 and 13. In one embodiment, the finger-shapes are interleaved and arranged in an alternating pattern.

Figure 4:
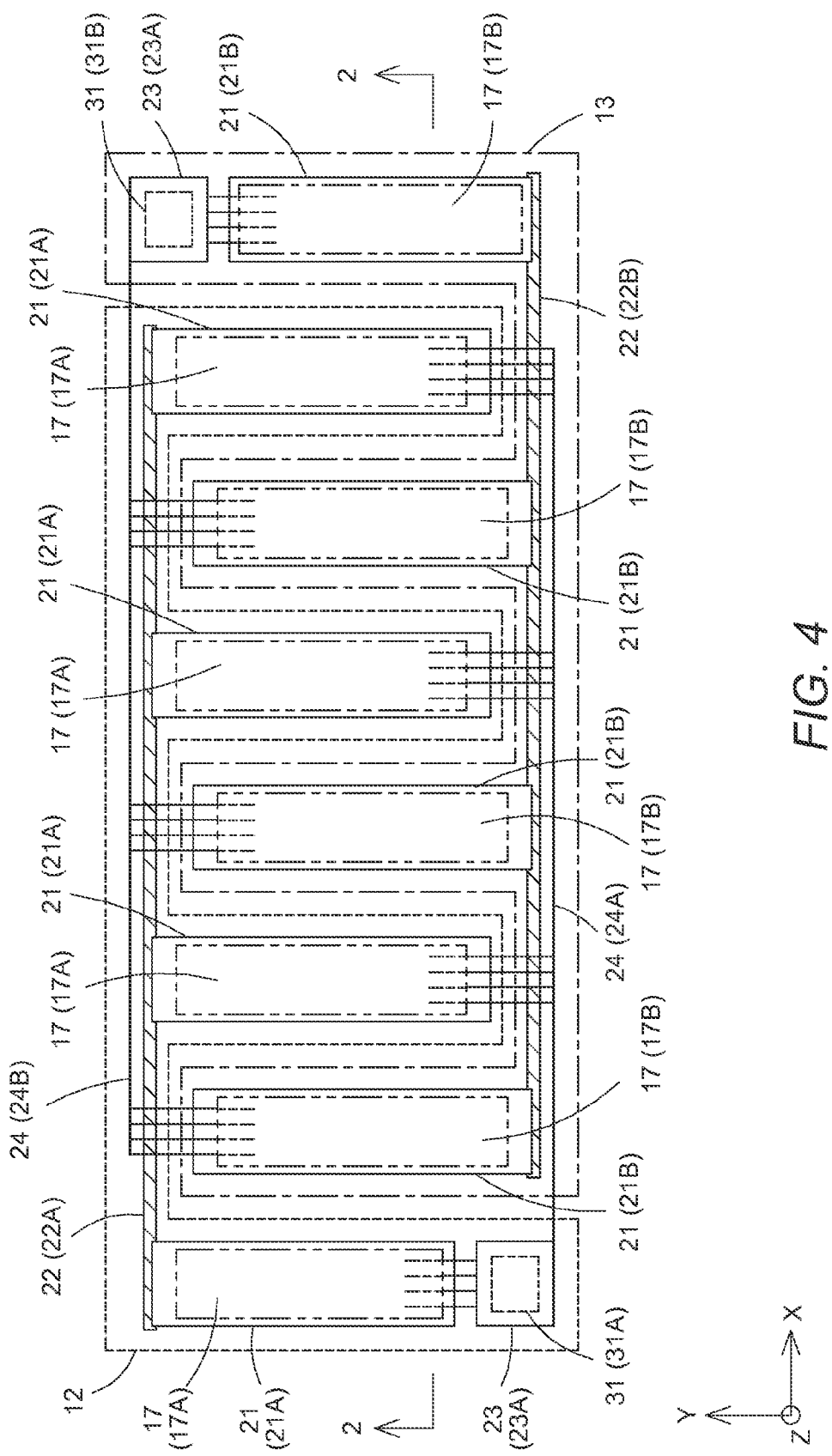
FIG. 4 illustrates a top view of an inner-layer of a common drain semiconductor device in accordance with an embodiment of the present invention.

FIG. 4 illustrates a top view of an inner-layer on a surface of the xy-plane of the semiconductor device 10. FIG. 4 illustrates atop view of the device with elements 11, 19, 26, 27, and 32 removed for better illustration of the present embodiment. In one embodiment, the conductive layer 21 and a conductive electrode 22 may be electrically connected to aid in maintaining a specified potential across each conductive layer 21. The conductive layer 21 and the conductive electrode 22 may be formed from the same type of material, as described in FIG. 2. In one embodiment, the conductive layer 21 and the conductive electrode 22 may be connected, for example, to form a comb-shaped structure. For example, a first conductive layer 21A may be electrically connected to a first conductive electrode 22A (belonging to the first transistor 12), and a second conductive layer 21B may be electrically connected to a second conductive electrode 22B (belonging to the second transistor 13). In one embodiment, the conductive electrodes 22A and 22B may be positioned on opposing sides, for example along a length 52, (as illustrated in FIG. 1) of the device 10.

FIG. 4 further illustrates a gate pad 23 where, for example, a first gate pad 23A belongs to the first transistor 12, and a second gate pad 23B belongs to the second transistor 13. The gate pad 23 may be electrically connected to a gate electrode 24. For example, a first gate pad 23A may be electrically connected to a first gate electrode 24A, each belonging to the first transistor 12, and, for example, a second gate pad 23B may be electrically connected to a second gate electrode 24B, each belonging to the second transistor 13. The gate electrode 24 may be electrically connected to the plurality of gate trench structures 18 within the plurality of active regions 17. For example, the first gate electrode 24A is electrically connected to the plurality of gate trench structures 18 within a plurality of first active regions 17A, which belong to the first transistor 12, and for example, the second gate electrode 24B is electrically connected to the plurality of gate trench structures 18 within a plurality of second active regions 17B, which belong to the second transistor 13. In one embodiment, the gate electrode 24A and 24B may be positioned on opposing sides, for example along length 52, (as illustrated in FIG. 1) of the device 10. In one embodiment, the first transistor 12 may have at least two active regions 17 having the same dimensions and aligned horizontally, while the second transistor 13 may have at least two active regions 17 having the same dimensions and aligned horizontally. In another embodiment, the active regions 17 do not overlap with the first gate pad 29C or the second gate pad 29D.

FIG. 4 further illustrates a protection device 31. In one embodiment, the protection device may be a diode. The protection device 31 provides electrostatic discharge protection for the device. The protection device 31 may be a bidirectional device wherein a p-n junction is formed through patterning, for example within a polysilicon layer (not shown) on a surface of the substrate 11 and below a surface of the gate pad 23. The protection device 31 may also be formed by diffusing p-type impurity and an n-type impurity in a patterned polysilicon layer. In one embodiment, the protection device 31 provides two structures, each with nested ring shapes (not shown).

Figure 5:
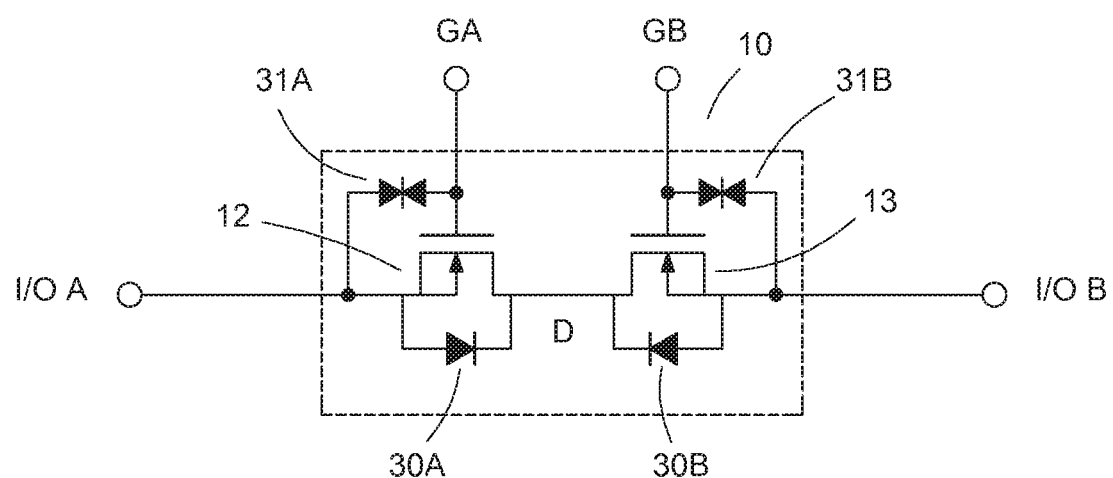
FIG. 5 schematically illustrates an embodiment of a circuit of the common drain semiconductor device in accordance with an embodiment of the present invention.

FIG. 5 schematically illustrates a circuit of the common drain semiconductor device 10 having a first transistor 12 and a second transistor 13 connected in series sharing a common drain D. In one embodiment, the first transistor 12 and the second transistor 13 may be bi-directional a metal oxide semiconductor field effect transistors (MOSFET). FIG. 5 further illustrates external gate electrodes GA, GB where, for example, GA belongs to the first transistor 12 and GB belongs to the second transistor 13.

FIG. 5 further illustrates external source electrodes I/OA, I/OB which serve as input/outputs for the device allowing bi-directional electrical current, for example I/OA belongs to the first transistor 12 and I/OB belongs to the second transistor 13.

FIG. 5 further illustrates a protection device 31A, for example a diode, that may be electrically connected in parallel with the source and the gate GA of the first transistor 12, and a protection device 31B, for example a diode, that may be electrically connected in parallel to the source and the gate GB of the second transistor 13. In one embodiment, the protection device 31 may be a bidirectional device. FIG. 5 further illustrates diodes 30A and 30B, that may be electrically connected in parallel with the source and the drain D of each of the first transistor 12 and the second transistor 13. Diodes 30A and 30B may provide the breakdown voltage for the first transistor 12 and second transistor 13 between the respective drain and source while the gate and source are shorted.

In one embodiment, the inventors observed simulations which provided higher overall source-to-source current density. The increased current density provides a decreased source-to-source on-resistance, $R_{SSON}$ (mΩ), thereby providing a decreased source-to-source times area, $R_{SSON}*A$ (mΩ*mm$^2$). In one embodiment, the inventor observed simulations which provided a twenty-six percent (26%) reduction in the parameter $R_{SSON}*A$. Further, the inventors observed that decreasing the wafer thickness, for example from 200 microns to 100 microns, did not have as much of an effect on the $R_{SSON}$ than with the previous configurations where, for example, simulations of previous devices demonstrate a larger reduction in $R_{SSON}*A$ with decreased the wafer thickness. Therefore, in at least one embodiment, it is not necessary to provide a thinner wafer to produce a lower $R_{SSON}$, which allows for the use of a wafer that is less prone to cracking.

From all the foregoing, one skilled in the art can determine that according to one embodiment, a semiconductor device comprises a substrate for example, element 11) having first and second opposing major surfaces; a plurality of first active regions (for example, elements 17A) in the substrate adjacent the first major surface, wherein the first active regions and the substrate form a first transistor (for example element 12); a plurality of second active regions (for example, elements 17B) in the substrate adjacent the first major surface, wherein the second active regions and the substrate form a second transistor (for example, element 13), and wherein the plurality of first active regions and the plurality of second active regions are interleaved and arranged in an alternating pattern; a plurality of gate trench structures (for example, elements 18) within the plurality of first active regions and the plurality of second active regions; a plurality of first conductive layers (for example, elements 21A) coupled to the plurality of first active regions adjacent the first major surface; a plurality of second conductive layers (for example, elements 21B) coupled to the plurality of second active regions adjacent the first major surface, wherein the plurality of first conductive layers and the plurality of second conductive layers are interleaved and arranged in the alternating pattern.

Those skilled in the art will also appreciate that according to another embodiment, a semiconductor device comprises a substrate (for example, element 11) having first and second opposing major surfaces; a plurality of first active regions (for example, elements 17A) in the substrate adjacent the first major surface, wherein the plurality of first active regions and the substrate form a first transistor (for example, element 12); a plurality of second active regions (for example, elements 17B) in the substrate adjacent the first major surface, wherein the plurality of second active regions and the substrate form a second transistor (for example, element 13), and wherein the plurality of first active regions and the plurality of second active regions are interleaved and arranged in an alternating pattern; a plurality of gate trench structures (for example, elements 18) within the plurality of first active regions and the plurality of second active regions; a plurality of first conductive layers (for example, elements 21A) coupled to the plurality of first active regions adjacent the first major surface; a plurality of second conductive layers (for example, elements 21B) coupled to the plurality of second active regions adjacent the first major surface, wherein the plurality of first conductive layers and the plurality of second conductive layers are interleaved and arranged in the alternating pattern; an interlayer dielectric layer (for example, element 19) adjacent the first major surface and the plurality of first active regions and the plurality of second active regions, wherein the interlayer dielectric layer is between the first major surface and the plurality of first conductive layers and the plurality of second conductive layers; a first passivation layer (for example, element 26) on the plurality of first conductive layers and the plurality of second conductive layers, the first passivation layer having first openings adjacent at least portions of the plurality of first conductive layers and the plurality of second conductive layers; under bump structures (for example, element 28) disposed in the first openings and electrically coupled to the plurality of first conductive layers and the plurality of second conductive layers, and wherein surfaces of the under bump structures are configured as conductive pads (for example, element 29); a first gate electrode (for example, element 24A) adjacent the major surface and electrically coupled to the plurality of gate trench structures in the plurality of first active regions and a first gate pad (for example, element 29C); and a second gate electrode (for example, element 24B) adjacent the major surface and electrically coupled to the plurality of gate trench structures in the plurality of second active regions and a second gate pad (for example, element 29D).

Those skilled in the art will also appreciate that according to one embodiment, a method of forming a semiconductor device comprises providing a substrate (for example, element 11) having first and second opposing major surfaces; forming a plurality of first active regions (for example, elements 17A) in the substrate adjacent the first major surface, wherein the plurality of first active regions and the substrate form a first transistor (for example, element 12); forming a plurality of second active regions (for example, elements 17B) in the substrate adjacent the first major surface, wherein the plurality of second active regions and the substrate form a second transistor (for example, element 13), and wherein the plurality of first active regions and the plurality of second active regions are interleaved and arranged in an alternating pattern; forming a plurality of gate trench structures (for example, elements 18) within the plurality of first active regions and the plurality of second active regions; forming an interlayer dielectric layer (for example, element 19) adjacent the first major surface and the plurality of first active regions and the plurality of second active regions; forming a plurality of first conductive layers (for example, elements 21A) on the interlayer dielectric layer and coupled to the plurality of first active regions; forming a plurality of second conductive layers (for example, elements 21B) on the interlayer dielectric and coupled to the plurality of second active regions adjacent the first major surface, wherein the plurality of first conductive layers and the plurality of second conductive layers are interleaved and arranged in the alternating pattern; forming a first a passivation layer (for example, elements 26) on the plurality of first conductive layers and the plurality of second conductive layers, the first passivation layer having first openings adjacent at least portions of the plurality of first conductive layers and the plurality of second conductive layers; forming under bump structures (for example, element 28) disposed in the first openings and electrically coupled to the plurality of first conductive layers and the plurality of second conductive layers, and wherein surfaces of the under bump structures are configured as conductive pads (for example, elements 29); forming a first gate electrode (for example, element 24A) adjacent the major surface and electrically coupled to the plurality of gate trench structures in the plurality of first active regions; and forming a second gate electrode (for example, element 24B) adjacent the major surface and electrically coupled to the plurality of gate trench structures in the plurality of second active regions.

In view of all the above, it is evident that a novel structure and method is disclosed. Included in one embodiment, among other features, is an integrated substrate having one or more transistors embedded therein. The structure and method increases current density, thereby reducing source-to-source on-resistance which increases performance and extends the life of an external device. Due to the decreased source-to-source on-resistance, the device may be made to smaller dimensions than prior devices, where the larger resistance value prohibited a smaller-dimensioned device. The structure is further compatible with existing assembly process, which reduces cost and eases implementation. The structure can also be produced without the third conductive layer, further reducing the cost.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor device comprising:
a substrate having first and second opposing major surfaces;
a plurality of first active regions in the substrate adjacent the first major surface, wherein the first active regions and the substrate form a first transistor;
a plurality of second active regions in the substrate adjacent the first major surface, wherein the second active regions and the substrate form a second transistor, wherein the plurality of first active regions and the plurality of second active regions are interleaved and arranged in an alternating pattern;
a plurality of gate trench structures within the plurality of first active regions and the plurality of second active regions;
a plurality of first conductive layers coupled to the plurality of first active regions adjacent the first major surface;
a plurality of second conductive layers coupled to the plurality of second active regions adjacent the first major surface;
a first conductive electrode electrically coupling the plurality of first conductive layers together; wherein the first conductive electrode and the plurality of first conductive layers are configured in a comb-like pattern;
a second conductive electrode electrically coupling the plurality of second conductive layers together; wherein the second conductive electrode and the plurality of second conductive layers are configured in a comb-like pattern; and
wherein the plurality of first conductive layers and the plurality of second conductive layers are interleaved and arranged in the alternating pattern.

2. The device of claim 1 further comprising:
a first gate electrode adjacent the major surface and electrically coupled to the plurality of gate trench structures in the plurality of first active regions and a first gate pad; and
a second gate electrode adjacent the major surface and electrically coupled to the plurality of gate trench structures in the plurality of second active regions and a second gate pad.

3. The device of claim 2, wherein the first gate pad and the second gate pad are arranged in opposing diagonal corners of the device.

4. The device of claim 2, wherein the first gate electrode and the second gate electrode are arranged on opposing sides of the device.

5. The device of claim 1 further comprising:
an interlayer dielectric layer adjacent the first major surface and the first active regions and the second active regions, wherein the interlayer dielectric layer is between the first major surface and the first conductive layers and the second conductive layers.

6. The device of claim 5 further comprising:
a first passivation layer on the first conductive layers and the second conductive layers, the first passivation layer having first openings adjacent at least portions of the first conductive layers and the second conductive layers.

7. The device of claim 6 further comprising:
under bump structures disposed in the first openings and electrically coupled to the plurality of first conductive layers and the plurality of second conductive layers, and
wherein surfaces of the under bump structures are configured as conductive pads.

8. The device of claim 7 further comprising a second passivation layer on the first passivation layer, the second passivation layer having second openings, and wherein the under bump structures are further disposed in the second openings.

9. The device of claim 7, wherein the conductive pads are arranged in a stripe-shape, extending along a width of the device.

10. The device of claim 1, wherein the first conductive electrode and the second conductive electrode are on opposing sides of the device.

11. The device of claim 1, wherein the first transistor and the second transistor have an equal number of active regions.

12. The device of claim 1, wherein the plurality of first conductive layers and the plurality of second conductive layers are configured to be separately biased.

13. The device of claim 1 further comprising a third conductive layer on the second major surface.

14. A semiconductor device comprising:
a substrate having first and second opposing major surfaces;
a plurality of first active regions in the substrate adjacent the first major surface, wherein the plurality of first active regions and the substrate form a first transistor;
a plurality of second active regions in the substrate adjacent the first major surface, wherein the plurality of second active regions and the substrate form a second transistor, wherein the plurality of first active regions and the plurality of second active regions are interleaved and arranged in an alternating pattern;
a plurality of gate trench structures within the plurality of first active regions and the plurality of second active regions;
a plurality of first conductive layers coupled to the plurality of first active regions adjacent the first major surface;
a plurality of second conductive layers coupled to the plurality of second active regions adjacent the first major surface, wherein the plurality of first conductive layers and the plurality of second conductive layers are interleaved and arranged in the alternating pattern;
an interlayer dielectric layer adjacent the first major surface and the plurality of first active regions and the plurality of second active regions, wherein the interlayer dielectric layer is between the first major surface and the plurality of first conductive layers and the plurality of second conductive layers;
a first passivation layer on the plurality of first conductive layers and the plurality of second conductive layers, the first passivation layer having first openings adjacent at least portions of the plurality of first conductive layers and the plurality of second conductive layers;
under bump structures disposed in the first openings and electrically coupled to the plurality of first conductive layers and the plurality of second conductive layers, and wherein surfaces of the under bump structures are configured as conductive pads;
a first conductive electrode electrically coupling the plurality of first conductive layers together; wherein the first conductive electrode and the plurality of first conductive layers are configured in a comb-like pattern;
a second conductive electrode electrically coupling the plurality of second conductive layers together; wherein the second conductive electrode and the plurality of second conductive layers are configured in a comb-like pattern;

a first gate electrode adjacent the major surface and electrically coupled to the plurality of gate trench structures in the plurality of first active regions and a first gate pad; and a second gate electrode adjacent the major surface and electrically coupled to the plurality of gate trench structures in the plurality of second active regions and a second gate pad.

15. The semiconductor device of claim 14 further comprising:

a second passivation layer on the first passivation layer, the second passivation layer having second openings, and wherein the under bump structures are further disposed in the second openings, and wherein:

the conductive pad regions are arranged in a stripe-shape, extending along a width of the device;

the first conductive electrode and the second conductive electrode are on opposing sides of the device; and the plurality of first conductive layers and the plurality of second conductive layers are configured to be separately biased.

16. A method of forming a semiconductor device comprising:

providing a substrate having first and second opposing major surfaces;

forming a plurality of first active regions in the substrate adjacent the first major surface, wherein the plurality of first active regions and the substrate form a first transistor;

forming a plurality of second active regions in the substrate adjacent the first major surface, wherein the plurality of second active regions and the substrate form a second transistor, wherein the plurality of first active regions and the plurality of second active regions are interleaved and arranged in an alternating pattern;

forming a plurality of gate trench structures within the plurality of first active regions and the plurality of second active regions;

forming an interlayer dielectric layer adjacent the first major surface and the plurality of first active regions and the plurality of second active regions forming a plurality of first conductive layers on the interlayer dielectric layer and coupled to the plurality of first active regions;

electrically coupling the plurality of first conductive layers together with a first conductive electrode, wherein the first conductive electrode and the plurality of first conductive layers are configured in a comb-like pattern;

forming a plurality of second conductive layers on the interlayer dielectric layer and coupled to the plurality of second active regions adjacent the first major surface, electrically coupling the plurality of second conducive layers together with a second conductive electrode, wherein:

the second conductive electrode and the plurality of second conductive layers are configured in a comb-like pattern; and the plurality of first conductive layers and the plurality of second conductive layers are interleaved and arranged in the alternating pattern;

forming a first a passivation layer on the plurality of first conductive layers and the plurality of second conductive layers, the first passivation layer having first openings adjacent at least portions of the plurality of first conductive layers and the plurality of second conductive layers;

forming under bump structures disposed in the first openings and electrically coupled to the plurality of first conductive layers and the plurality of second conductive layers, and wherein surfaces of the under bump structures are configured as conductive pads;

forming a first gate electrode adjacent the major surface and electrically coupled to the plurality of gate trench structures in the plurality of first active regions; and forming a second gate electrode adjacent the major surface and electrically coupled to the plurality of gate trench structures in the plurality of second active regions.

17. The method of claim 16 further comprising:

forming a second passivation layer on the first passivation layer, the second passivation layer having second openings, and wherein the under bump structures are further disposed in the second openings, wherein:

forming the conductive pads comprises arranging the conductive pads in a stripe-shape, extending along a width of the device;

forming the first conductive electrode and the second conductive electrode comprises forming the first conductive electrode and the second conductive electrode on opposing sides of the device; and forming the plurality of first conductive layers and the plurality of second conductive layers comprises configuring the plurality of first conductive layers to be separately biased from the plurality of second conductive layers.

* * * * *